United States Patent [11] 3,620,851

[72] Inventors William J. King
9 Putnam Road, Reading, Mass.;
Frederick W. Martin, Hoffmansvej 30,
Brabrand, Denmark

[21] Appl. No. 880,447
[22] Filed Dec. 4, 1969
[45] Patented Nov. 16, 1971
Original application Oct. 16, 1967, Ser. No. 675,688. Divided and this application Dec. 4, 1969, Ser. No. 880,447

[54] METHOD FOR MAKING A BURIED LAYER SEMICONDUCTOR DEVICE
3 Claims, 11 Drawing Figs.

[52] U.S. Cl. .......... 148/1.5, 29/576, 148/186, 148/187, 317/235 AC
[51] Int. Cl. .......... H01l 7/54
[50] Field of Search .......... 148/1.5, 186, 187; 29/576; 317/235 AL

[56] References Cited
UNITED STATES PATENTS
3,388,009 6/1968 King .......... 148/1.5

*Primary Examiner*—L. Dewayne Rutledge
*Assistant Examiner*—R. A. Lester
*Attorneys*—Henry C. Nields and Francis J. Thornton

ABSTRACT: This device contains a region imbedded completely within its body which is of opposite conductivity type than the body and which is separated from the body by two distinct PN-junctions. The imbedded region is produced by ion implantation and differs from such regions produced by other means in that the percentage compensation of dopant impurities between the region and all points on the surface of the body may be small, that is, one percent or less.

INVENTOR
FREDERICK W. MARTIN
WILLIAM. J KING
BY Francis J. Thornton
ATTORNEY

INVENTOR
FREDERICK W. MARTIN
WILLIAM J. KING
BY Francis J. Thornton
ATTORNEY

METHOD FOR MAKING A BURIED LAYER SEMICONDUCTOR DEVICE

The present invention for a division of application, Ser. No. 675,688 filed Oct. 16, 1967 and relates to radiation detection devices and more particularly to a solid-state device capable of detecting and measuring the energy and atomic number of impinging particles.

BACKGROUND OF THE INVENTION

The prior art has demonstrated that various energetic particles, such as protons, alpha particles and heavy ions, may be detected and that their energy and charge may be determined by the use of two detectors in conjunction. The first, called a dE/dx detector, measures the rate of energy loss of the particle, and the second, called an E detector, measures essentially the total energy of the particle.

Prior to the advent of the semiconductor diode, a parallel plate ionization chamber was used as a dE/dx detector and a sodium iodide scintillation crystal was used as an E detector. With the discovery that PN junction diodes could measure the total energy of particles, the scintillation crystal was soon replaced with a diode because of the greater accuracy in measurement of the total energy E which resulted. Such diodes were used in conjunction with an ionization chamber which acted as the dE/dx detector. After further development of the semiconductor art, devices were produced to replace the ionization chamber, resulting in a completely solid-state dE/dx-E system. Such solid-state detector systems comprise a semiconductor PN diode used as the E detector and a separated thin semiconductor PN-diode as the dE/dx detector. Typically there is nothing extraordinary about the E detector. On the other hand the dE/dx detector is very difficult to produce and is very expensive.

Generally such dE/dx solid state devices are constructed from a single slice of 10,000 ohm-cm. P-type silicon. The slices are first ground and etched to approximately 0.010 inches in thickness and treated to produce therein a diffused N-type layer about 2 microns in thickness. After diffusion the undiffused side of the unit is lapped and etched to reduce the slice thickness to between 0.001 and 0.002 inches. This reduction must be such that flat, accurately parallel surfaces are obtained. Electrical connections are then made to the bulk and to the N-type region and the device encapsulated.

Such dE/dx devices made by these prior art techniques have many drawbacks.

The diffusion step is very difficult to control in order to obtain uniform shallow depths.

Moreoever such devices are quite difficult to produce in quantity because of the extreme delicacy of the grinding and lapping steps.

Additionally their thinness prevents their use in applications where they might be subject to high shock or acceleration, or to normal handling by untrained personnel. Their thinness also makes them more susceptible to abrasion, since a scratch made inadvertently by rubbing with one small chip of silicon, for example, will cause a thin slice to break under much reduced bending force.

Finally these prior art devices are limited to identification of the lighter particles, and are totally incapable of identification of the heavier ions such as oxygen, because of the minimum practical thickness of about 25 microns obtainable in the dE/dx detector. This limit is set because heavy ions, having a shorter range than light particles, usually stop completely in the dE/dx detector of a dE/dx-E system.

SUMMARY

The present invention avoids all of the difficulties and drawbacks encountered in the production and application of prior art devices. Specifically, the devices built in accordance with the present invention are easier to fabricate and thus less costly; more compact; of greater structural strength and thus less susceptible to shock, acceleration, and rough handling; and, because of a thinness near 1 micron obtainable in the dE/dx detector, they are able to identify and measure the energy of a wider range of charged particles than the prior art devices. Additionally the present invention provides in a single integral body of semiconductor material both a dE/dx detector and an E detector.

Broadly speaking, these and other advantages and features of the present invention are achieved through the formation and utilization of a buried layer of impurities of conductivity type opposite to that of impurities in the bulk whereby there is provided in the device a pair of back-to-back PN junctions.

DESCRIPTION OF THE DRAWINGS

The invention can best be understood by study of the following specifications taken in conjunction with the drawings wherein.

DESCRIPTION OF THE PREFERRED EMBODIMENTS

Figures 1, 2, 3, 4, 5, 6, 7:
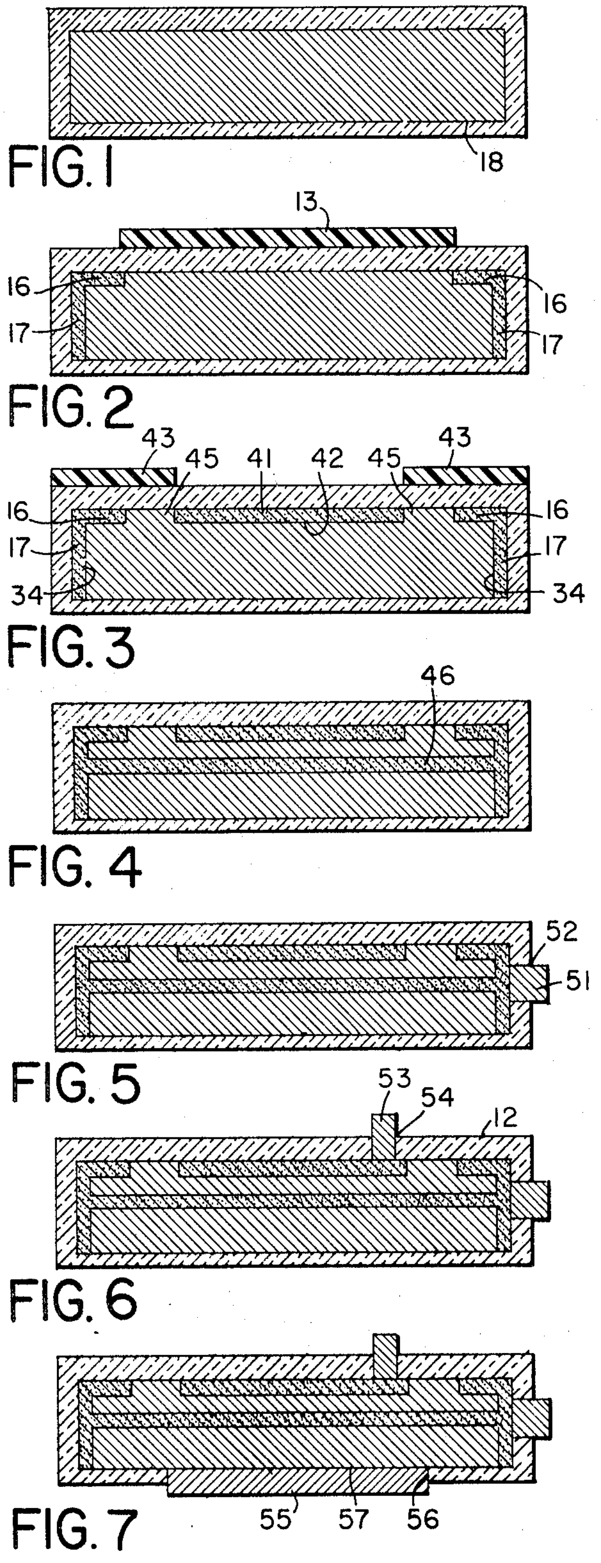
FIGS. 1 to 7 illustrate the unit in various stages of manufacture.

Referring now to these figures one specific embodiment and its method of construction will be given.

A slice of 10,000 ohm-cm. N-type silicon 10 having a diameter of approximately 1 inch and a thickness of approximately 0.1 inch is coated on its surface with a 1,000 angstrom thick layer of silicon oxide. Such a layer may be produced by a thermal deposition step well known to the prior art, or by high vacuum sputtering at temperatures less than 100° C. Following the establishment of the oxide layer 12 the central portion of the slice 10 and oxide layer 12 is covered with photographic emulsion 13, such as photoresist. Other materials for masking, such as wax or a thin metal foil, may also be used. However, photoresist material is preferred since sharper resolution of the masked areas may be achieved. This masking leaves uncovered a ringlike area around the periphery of slice 10. Following these preparatory steps, the crystal 10 is mounted on sample holder 14 by means of silicone grease and placed in the ion implantation apparatus shown schematically in FIG. 9.

This apparatus basically comprises an ion source 20, mounted on the top of an accelerator tube 21. From the accelerator tube 21 boron ions, in the form of a beam 22, emerge and pass through a momentum analyzing system, which purifies the beam, that is makes the beam monoatomic and monoenergetic such as analyzing magnet 23. The ion beam emerging from the analyzing magnet 23 is passed through a deflection system which may be composed of horizontal beam scanner plates 24 and vertical beam scanner plates 25. The scanned beam emerges from the base scanner plates and is directed upon the coated surface 11 of the slice 10. The supporting plate 14 is maintained in an evacuated chamber 26 by fixture 27, which permits rotation of the slice 10 and plate 14 about an axis perpendicular to the direction of the ion beam. The deflection plates in the apparatus are used to deploy the beam, so that it may be made to scan the entire face of the body 10.

The boron ions are thus implanted only in the perimeter region 16 and 17 which is uncovered by the photoresist coating 13. Ions are stopped from penetrating into the masked area of slice 10 by the photoresist 13 which is made sufficiently thick to prevent the ions from passing therethrough. In these areas which are unmasked by the photoresist, certain of the ions striking the oxide pass through the oxide into the underlying silicon body, while others are stopped by the oxide. The depth of penetration of the ions into the silicon body in the unmasked areas is a function of the energy of the impinging ions, the orientation of the crystal lattice, and the thickness of the oxide layer. The ion concentration at any depth within the silicon is proportional to the length of time that a beam of specified flux and energy continues to strike the surface, and is also a function of the parameters listed above which determine the depth of penetration. By controlling these variables, any desired spatial distribution of ions may be implanted in the body.

Figure 9:
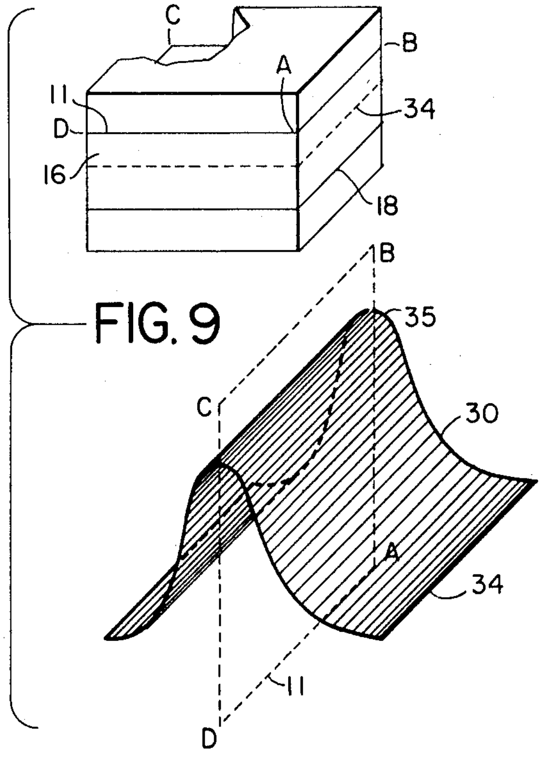
FIGS. 9 and 10 illustrate the distribution of implanted ions in the device.
Figure 10:
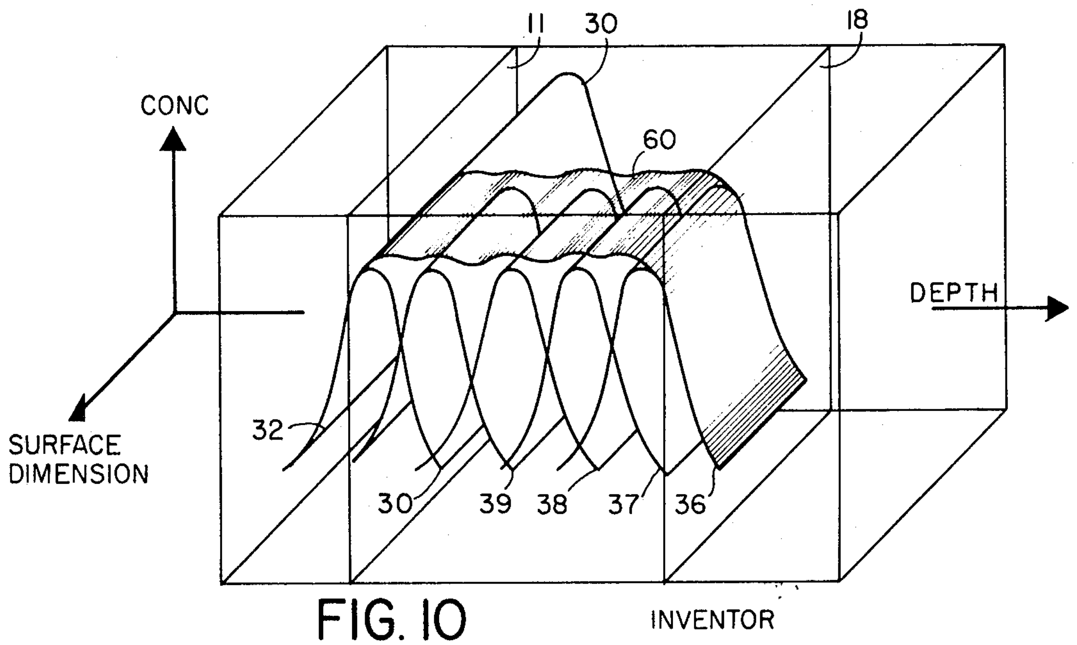

This may be more clearly understood by reference to FIGS. 9 and 10, wherein there are shown various views of the implanted region 16 and schematic representations of the ion penetration and concentration therein. In FIG. 9 the boundaries of various regions about the region 16 are shown, and an additional schematic representation of the concentration of ions near the plane ABCD is shown (note that plane ABCD is rotated from one part of FIG. 9 to the other). The meshlike section 30 is a three dimensional representation of the concentration of arrested ions, in which the vertical coordinate is the number of ions per unit volume, the coordinate perpendicular to plane ABCD is the depth beneath the surface of the slice, and the third coordinate is distance parallel to the surface of the slice. The distribution 30 is in turn one of several such surfaces shown in the same representation in FIG. 10, which will be described more fully below.

The spatial distribution 30 results when ions of one discrete energy are implanted in the body. In such a case, the concentration of ions versus depth follows approximately a Gaussian, or normal, distribution. Both the depth at which the maximum of the Gaussian distribution occurs and the distance between the half maximum points of the distribution depend on the energy of the ions and on the orientation of the crystal lattice. In FIG. 9 these parameters are chosen so that the peak 35 of the distribution 30 has fallen at the oxide-silicon interface 11.

Other choices may be made; for instance if the energy of the ions is increased the distribution 36 shown in FIG. 10 may be produced. This is the manner in which the buried layer 46 to be described below was made. If the energy of the ions is reduced in steps, producing regions 37, 38, 39, and 30 of FIG. 10, the concentrations produced by implantations at different energies will add to produce the envelope 60. Alternatively the distributions 37, 38, 39, and 30 may be produced with an ion beam of fixed energy by successively increasing the angle between the beam direction and the normal to the surface. Also, the different distributions 36, 37, 38, 39, and 30 shown in FIG. 10 each contain the same number of ions; if the relative number of ions in the different distributions is varied, envelopes of different shape than 60 may easily be produced.

When P-type impurities such as boron are implanted in an N-type semiconductor, doped for example with phosphorus, a junction is formed where the number of electrically active boron ions per unit volume becomes greater than that of phosphorus ions. In the single implantation of FIG. 9 this occurs along the line 34. In the multiple implantations of FIG. 10 it occurs where plane 18 and distribution 36 intersect. Planes 18 and 11 thus form the boundaries of a thin P-type region on the surface of an N-type silicon body. It is to be noted that if distribution 36 alone were implanted, the plane 18, as determined from the equality in concentration of P-type and N-type impurities, would remain in the same position, but that the upper boundary now set at plane 11 would occur deeper in the body of the semiconductor and would then form the boundaries of a thin P-type region entirely buried within the body of an N-type piece of silicon. It is in this manner that the buried layer 46, to be described below, is formed.

The simplest way to obtain deep penetrations is to increase the energy of the incident ions, as described above. Alternatively, the orientation of the lattice may be chosen so that the penetration of ions is especially great even without increasing their energy. This effect may be better understood through a brief discussion of the crystal structure of the materials used in this invention.

The silicon oxide layer 12 is amorphous when grown on the surface, that is, this layer has no definite or regular crystalline structure or texture. Thus, on a statistical basis, the ions penetrating the oxide are all impeded to the same degree.

On the other hand, the underlying semiconductor body has a regular crystalline structure. Such crystalline structures have long been studied and are known to have crystal planes which are defined by the so-called Miller indices. Certain paths perpendicular to these planes are known as low index directions. For example, in silicon, these would be the 110 and 100 directions. When ions are implanted in the crystal by beaming them along these "easy" paths, they can penetrate the depths which are up to 10 times greater than ions implanted in amorphous material. This penetration along easy paths is known as channelling, and by its use deep ion implantation can be obtained.

Only a fraction of the incident ions can travel down the channels along the low-index directions in the crystal lattice. The remaining ions strike atoms of the lattice and are deflected into more or less normal trajectories such that they penetrate only the usual amount. These nonchanneled ions present a practical difficulty. However, they are separated from the channeled ions by their smaller penetration, and in no way influence the concentration of the channeled ions; and their effect can be cancelled out by a subsequent implantation of ions of the opposite conductivity type. In addition their number may be small enough to be negligible; in tungsten crystals, for instance, the fraction channeled can be as high as 90 percent when the incident beam is collimated to within 0.1° of the channel axis.

Thus the nonchanneled ions present a complication which may be small and which in any case can be cancelled out. This complication does not alter the main advantage of the channeling process, which is deep penetration without the need for accelerating heavy particles to high energies. A second advantage of channeling is that the distance between half maximum points of the distribution of channeled ions appears to be much less than for nonchanneled ions of the same penetration depth.

Returning now to the steps in production of a device, ions of such an energy as to stop within photoresist layer 13 and yet to pass through the unmasked oxide coating 12 are played on the surface of the oxide-coated slice to form regions 16 and 17. In the device described 200 Kev. boron ions were used with a mean penetration of approximately 0.4 microns of silicon or silicon dioxide.

Figures 8, 11:
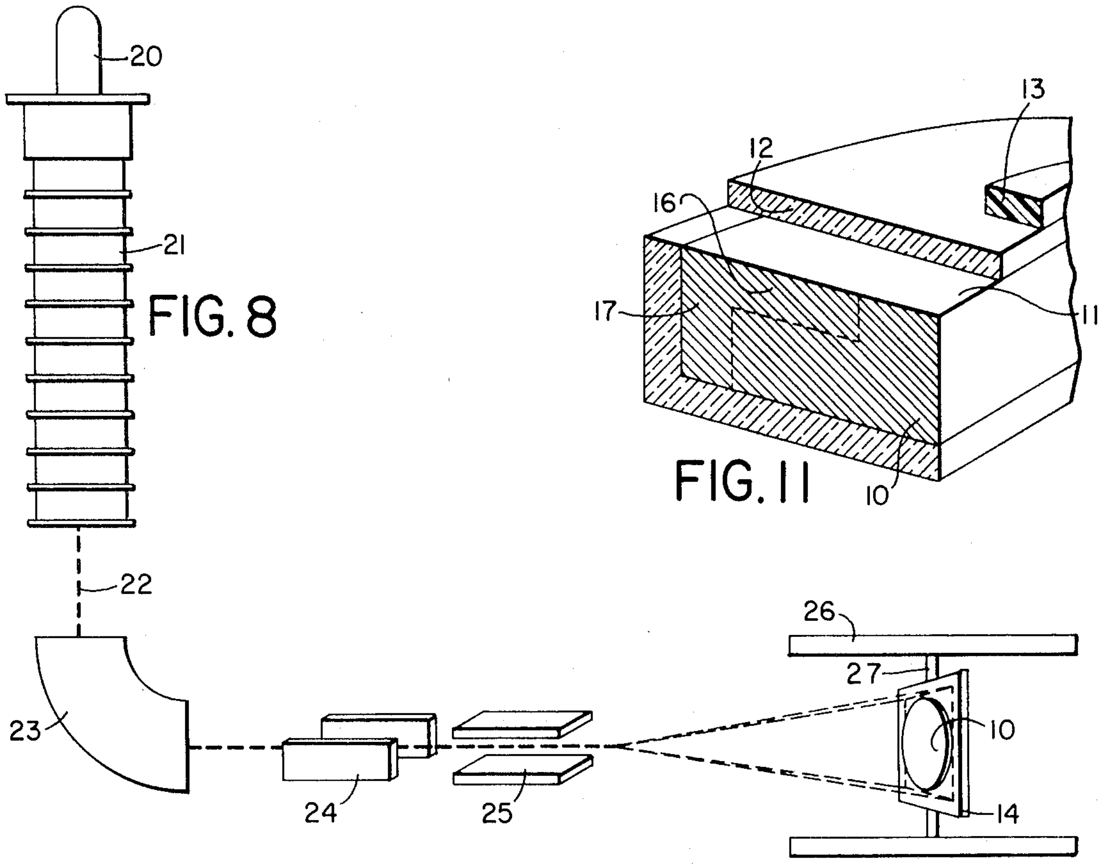
FIG. 8 illustrates, schematically the ion-implantation apparatus used in practicing the invention.
FIG. 11 is an enlarged view of the implanted areas of FIG. 2.

In constructing the device regions 16 and 17 were implanted at the same time with only the photoresist coating 13 in place. To achieve this with the rotation apparatus 27 of FIG. 8 the slice was so placed that the beam of ions fell solely on the edge of the silicon, in the direction of a diameter of the slice. The slice was then rotated slowly through 90° until the ions were striking in a direction perpendicular to the front surface of the slice, and then rotated slowly a further 90° until the ions fell solely on the edge of the silicon, along the same diameter as at the beginning but in the opposite direction. To ensure that regions 16 and 17 were formed at all points on the perimeter of the slice, this procedure was performed a second time with the slice placed differently in the rotating apparatus 27. The change in position consisted of a rotation of 90° about the axis of the slice. At the beginning of the second irradiation, ions thus fell on the slice in the direction of a diameter which was at right angles to the diameter of the first irradiation. The details of this procedure are not important to the invention; any boron ion beam which was sufficiently close to the normal to all surfaces involved and of sufficient energy, so that it could penetrate the oxide coating 12 and form regions 16 and 17, would be acceptable.

The purpose of this boron implantation is solely to extend the P-type buried layer 46 into a region of large surface area to which electrical contact may be made. Layer 46 forms an electrically isolated region only 10 microns wide and would require a contact 51 of width approximately 5 microns in the absence of region 17. For this purpose enough ions should be used to ensure that the layer is a good electrical conductor. In the present example about $10^{14}$ boron ions per square centimeter were used, with a calculated sheet resistance of about 1,000 ohms per square.

The slice 10 was then removed from the chamber and photoresist layer 13 removed from the oxide layer. As shown in FIG. 3, photoresist layer 43 of approximately 0.1-inch smaller internal diameter than the implanted ring 16 was then formed on the oxide surface. N-type region 41 was then formed by implantation of 250 kev. phosphorus ions, estimated to have a mean range of about 0.2 microns in silicon or silicon dioxide.

The purpose of this N-type implantation in N-type material was to form a boundary for the depletion region of the dE/dx diode in the finished device. This purpose may be better understood after consideration of the distribution of the space charge in a reverse-biased diode. On the N-type side of the junction, as reverse bias is applied to the diode, the depletion layer advances into the N-type material, causing an increasingly large positive space charge. The work required to move a carrier through this space charge is approximately equal to the bias voltage. If the number of N-type impurities suddenly rises to a high value, as in the implanted layer, increases in the bias voltage will result in large amounts of positive space charge being generated without appreciable increase in the width of the depletion layer. By this means the depletion layer is prevented from extending to the surface of the silicon, and in particular from extending too close to the contacts.

A second purpose of the N-type implantation is to provide a layer of low surface sheet resistance through which charge may flow to the contacts from the point where it is generated in the dE/dx diode of the finished device. For these purposes about $3\times10^{13}$ phosphorus ions per square centimeter were used, resulting in the unexpectedly large value of 2 to 10 kilohms between contacts to the N-layer.

The slice 10 was then removed from the chamber and photoresist layer 43 removed from the oxide layer. As shown in FIG. 4, a deep-lying double P-N junction buried layer 46 was then formed by implanting the entire slice with boron ions. This was done using lens of 11- and 22-Mev. (11,000 and 22,000 Kev.) energy, although as discussed above channeled ions may in principle be used instead of high-energy ions. The mean penetration of the 11-Mev. ions was 14 microns, as estimated from measurements on the finished devices. The junctions formed by these ions were 5 to 9 microns on either side of the mean penetration, depending on the number of boron ions used, in agreement with the discussion above. The useful depths of the dE/dx counters were 5 and 8 microns. In a device with a buried or subterrain layer formed using 0.400 Mev. (400 Kev.) boron ions a potentially useful depth of 0.6 microns was obtained, although the particle signal in such a thin layer was so small that it could not be detected in the presence of noise.

In general, nonchanneled ions of energy greater than 0.1 Mev. may be used for the formation of buried layers. At energies lower than this the buried layer may become a surface layer, having only one bulk PN-junction associated with it. Dopant ions other than boron may be used, such as nitrogen and phosphorus, but they are less advantageous since they are heavier ions and do not penetrate as far.

In the present example, doses of $10^{13}$ to $10^{14}$ boron ions per square centimeter were used, resulting in a resistance between contacts to the P-layer lying between 160 and 1,200 ohms.

After the implantation of layer 46, the entire device was annealed in a vacuum of about $10^{-7E-6}$ millimeters of mercury for 15 minutes at 600° C. in order to activate all of the implanted regions 16, 17, 41, and 46. This annealing has been found necessary to decrease the resistivity of implanted layers to that calculated from the known number of implanted ions. It is possibly caused by a short-distance diffusion of the implanted ions from interstitial lattice positions where they are arrested into electrically active substitutional positions. The surfaces of the slice are protected from ambient vapors in the annealing furnace by the oxide coating. All measurements quoted above were made after this step and after contacts had been applied.

Following the formation of the buried layer 46 and the annealing step previously described, openings 52, 54, and 56 are made in the oxide coating 12 so that electrical contacts 51, 53, and 55 may be made to regions 41, 46, and the bulk at surface 57. These contacts can be made by any number of well known techniques such as evaporation, cold welding, thermocompression bonding, electroplating, chemical plating, etc., provided that the edge 42 of the thin region 41 is not appreciably affected.

In the device described here the contacts 51 were formed of a layer of evaporated titanium covered with a layer of evaporated silver. These materials are known to make a low-resistance ohmic contact to P-type material when fired at 600° C., without alloying into the body of the silicon. Accordingly the openings 52 and the contacts 51 were, in the device described, actually made before the annealing step. All annealing and firing operations were then carried out in the one anneal at 600° C. for 15 minutes. Subsequent to this anneal evaporated titanium covered with evaporated silver was used to make contact 53. These materials are found to make a satisfactory contact to N-type silicon when unfired. The back contact 55 was chemically plated from an electroless nickel plating solution.

The two junctions in devices constructed in this way operated as counter diodes. The dE/dx diodes of 0.5 inch diameter had reverse breakdown voltages between 12 and 34 volts and room temperature leakage currents of 2 to 14 microamperes just below breakdown. The E diodes of approximately 1 inch diameter had breakdown voltages from 20 to greater than 150 volts and rather large leakage currents at breakdown ranging from 270 to greater than 500 microamperes. In tests with 5.48 Mev. alpha particles made on a counter with an 11-Mev. boron implanted layer, the alpha particles deposited about 0.05 Mev. in the phosphorus implanted layer 41, 1.0 Mev. in the depletion region of the dE/dx diode, 1.45 Mev. in the boron implanted layer 46, and 3.0 Mev. in the depletion region of the E diode. The energy deposited in the depletion layer of the dE/dx diode corresponded to a thickness of 8 microns, which was in agreement, within experimental errors, with the value of 9 microns obtained from measurements of the capacitance of the diode.

In the above, one specific embodiment of the present invention has been shown and described. It will be obvious to those skilled in the art that changes and modifications may be made without departing from this invention in its broader aspects. For example, the semiconductor body need not be silicon but may be any semiconductor such as germanium, indium antimonide, gallium arsenide, or lead telluride. The body may be either P-type or N-type The ions used need not be boron and phosphorus, but may be any dopant ions which can be accelerated to energies sufficient to produce back-to-back junctions buried within the body of the semiconductor. The surface passivating layer need not be silicon oxide but may be any thin dielectric film. The passivating layer may be omitted, although this probably will result in surface leakage paths in parallel with the dE/dx and E diodes, with accompanying reduced breakdown voltage or increased leakage current.

Furthermore the dE/dx and E diodes may be used to detect radiations other than individual protons or heavy ions. Thus, if it is desired to count a low flux of weakly penetrating radiations in the presence of a high flux of penetrating radiations, pulses from the E counter may be used to gate off the output of the thin dE/dx counter. In this way the large number of pulses caused by the passage of penetrating radiations through the dE/dx counter will be rejected, and the only remaining pulses will be those from the weekly penetrating radiation. Examples of radiations to be detected in this way might be low energy protons in outer space, when mixed with large numbers of energetic electrons; or charged particles in a nuclear physics laboratory, when mixed with a large unwanted gamma ray background.

It is further apparent that the structure consisting of a buried dopant layer between back-to-back PN-junctions, once it is experimentally demonstrated, has uses in a wider portion of the semiconductor art than that concerned with nuclear radiation detection. In particular such a structure resembles a transistor, with the N-region 41 as an emitter, the P-type buried layer 46 as a base, and the N-type bulk of the slice as a collector. In fact, a device containing a buried layer made with 0.4 Mev. boron ions was tested in this way, and performed as a device with a current gain of 5 at 100 volts collector voltage and 5 milliamperes collector current.

It is also apparent that complicated structures may be synthesized by combinations of buried layers. For example, with reference to FIG. 10, if layer 36 is made with boron ions and layer 37 of less penetrating phosphorus ions, a device with a higher current gain than the one discussed above would be expected. As another example, again with reference to FIG. 10, if layer 36 is made with boron ions and layer 37 with 10 times fewer boron ions than layer 36, a structure with a heavy concentration of dopant ions near its deepest junction will be produced. In neither of these cases is an implantation peaking at the surface required, although contact must eventually be made to surface layers, for example in a geometry analogous to the joining of layers 46 and 17 in FIG. 4.

The dimensions of structures synthesized by combinations of buried layers may be varied by controlling the area over which ions strike the semiconductor body. This may be done by the use of masks, either of photoresist material as in the above example, or of other construction. It may possibly be done by the use of ion beams of restricted area which are swept over the desired larger area. Either by the use of masks or by on-off and position control of a small-diameter ion beam, singly or multiply connected regions of arbitrary shape such as rectangles, bars, circles, rings, etc. may be built up.

All of these structures, made by combinations of single buried layers, may be distinguished from similar structures made by diffusion by means of the distribution of impurities which they contain near their surfaces.

For example, a buried P-type layer between back-to-back PN-junctions made by diffusion must be made in two steps: first the diffusion of a P-type impurity, and then a shallower diffusion of an N-type impurity. The first diffusion always results in a much higher concentration of P-type ions near the surface than near the PN-junction which it creates. Therefore such a buried layer is characterized by a larger number of P-type ions per unit volume between the buried layer and the surface than within the buried layer. The second diffusion step also causes a high percentage compensation to exist in the region between the buried layer and the surface.

On the other hand, in a buried P-type layer made by ion implantation, no P-type ions need be implanted in the region between the buried layer and the surface. Such a buried layer is thus characterized by a lower number of P-type ions per unit volume between the buried layer and the surface than within the buried layer.

In general, in a buried layer between back-to-back PN-junctions made by ion implantation, the volume concentration of ions which are dominant within the buried layer declines from the buried layer toward the surface.

It should be noted that the distribution of typical dopant impurities can be determined by destructive testing. The absolute amounts can be found for example by neutron activation, in the case of boron by the ($n$, alpha) reaction with thermal neutrons, and in the case of phosphorus by production of beta-emitting $P^{32}$. The distribution of such impurities can be determined by destructive testing on samples which have had surface layers of known thickness removed by standard etching procedures.

Having now shown and described particular embodiments of the present invention and in addition certain changes and modifications thereof, it will be obvious to those skilled in the art that other changes and modifications may be made without departing from this invention in its broader aspects; and, therefore, it is the aim in the appended claims to cover all such changes and modifications as fall within the true spirit and scope of this invention.

What is claimed is:

1. The method of producing a semiconductor device comprising coating a body, of semiconductor material containing a concentration of an impurity of a first conductivity type, with a layer of silicon oxide, depositing an ion impervious mask over a central portion of said body, bombarding the body with a selected energy range of monatomic ions of an opposite-conductivity inducing impurity to form in said body a perimeter region of conductivity opposite to said body, removing said mask, masking the previously irradiated perimeter region, irradiating the unmasked central region of said body with a selected energy range of monatomic ions of an impurity of said first conductivity type to create in said body a surface region having a concentration of said first conductivity type impurity higher than the concentration of said type of impurities in said body, removing said perimeter mask, irradiating said body with a selected energy range of monatomic ions of an opposite conductivity type to form in the body a subterranean region of opposite conductivity, said region being connected with said perimeter region and separated from said surface region by a layer of said body containing a substantially lower concentration of said opposite conductivity impurity than said subterranean region, heating said body to remove the radiation damage created in said body, and forming electrical contact to said perimeter region, said surface region and said body.

2. The method of claim 1 wherein the irradiation of said body to form said subterranean region is directed along a low index direction of said body.

3. The method of claim 1 wherein the irradiation of said body to form said subterranean region uses ions having an energy greater than 0.1 Mev.